United States Patent
Ryan et al.

(10) Patent No.: US 7,268,057 B2
(45) Date of Patent: Sep. 11, 2007

(54) METHODS OF FILLING OPENINGS WITH OXIDE, AND METHODS OF FORMING TRENCHED ISOLATION REGIONS

(75) Inventors: Joseph M. Ryan, Boise, ID (US); Damon E. VanGerpen, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 364 days.

(21) Appl. No.: 11/095,186

(22) Filed: Mar. 30, 2005

(65) Prior Publication Data

US 2006/0228866 A1   Oct. 12, 2006

(51) Int. Cl.
*H01L 21/762* (2006.01)

(52) U.S. Cl. ............ 438/427; 438/435; 438/788; 257/E21.548

(58) Field of Classification Search ............ 438/435
See application file for complete search history.

(56) References Cited

U.S. PATENT DOCUMENTS

| | | | |
|---|---|---|---|
| 6,030,881 A * | 2/2000 | Papasouliotis et al. | 438/424 |
| 6,759,306 B1 | 7/2004 | Sharan et al. | |
| 6,777,308 B2 | 8/2004 | Li et al. | |
| 6,914,015 B2 * | 7/2005 | Belyansky et al. | 438/788 |
| 6,998,326 B2 * | 2/2006 | Kim | 438/424 |
| 7,033,908 B2 * | 4/2006 | Cha et al. | 438/435 |
| 7,033,909 B2 * | 4/2006 | Kim et al. | 438/435 |
| 7,205,240 B2 * | 4/2007 | Karim et al. | 438/694 |
| 2003/0143817 A1 * | 7/2003 | Ho et al. | 438/435 |
| 2005/0153519 A1 * | 7/2005 | Lu et al. | 438/424 |
| 2005/0158965 A1 * | 7/2005 | Bai et al. | 438/424 |
| 2005/0266655 A1 * | 12/2005 | Nemani et al. | 438/435 |

* cited by examiner

*Primary Examiner*—Stephen W. Smoot
(74) *Attorney, Agent, or Firm*—Wells St. John P.S.

(57) ABSTRACT

The invention includes methods in which oxide is formed within openings in a three-step process. A first step is deposition of oxide under a pressure of greater than 15 mTorr. A second step is removal of a portion of the oxide with an etch. A third step is an oxide deposition under a pressure of less than or equal to 10 mTorr. Methodology of the present invention can be utilized for forming trenched isolation regions, such as, for example, shallow trench isolation regions.

20 Claims, 10 Drawing Sheets

METHODS OF FILLING OPENINGS WITH OXIDE, AND METHODS OF FORMING TRENCHED ISOLATION REGIONS

TECHNICAL FIELD

The invention pertains to methods of filling openings with oxide, and in particular aspects pertains to methods of forming trenched isolation regions.

BACKGROUND OF THE INVENTION

Integrated circuitry is typically fabricated on and within semiconductor substrates, such as bulk monocrystalline silicon wafers. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Electrical components fabricated on substrates, and particularly bulk semiconductor wafers, are isolated from adjacent devices by insulating materials, such as, silicon dioxide. One isolation technique uses shallow trench isolation, whereby trenches are cut into a substrate and are subsequently filled with an insulating material, such as, for example, silicon dioxide.

Integrated circuitry frequently comprises a densely-packed array of memory devices surrounded by so-called peripheral circuitry (i.e., circuitry which is peripheral to the memory array). Accordingly, a semiconductor substrate can be divided into a memory array region, and a region peripheral to the memory array region. Frequently, there will be an isolation trench formed between the memory array region and the peripheral region, with such trench being formed simultaneously with the shallow trench isolation regions.

Figure 1:
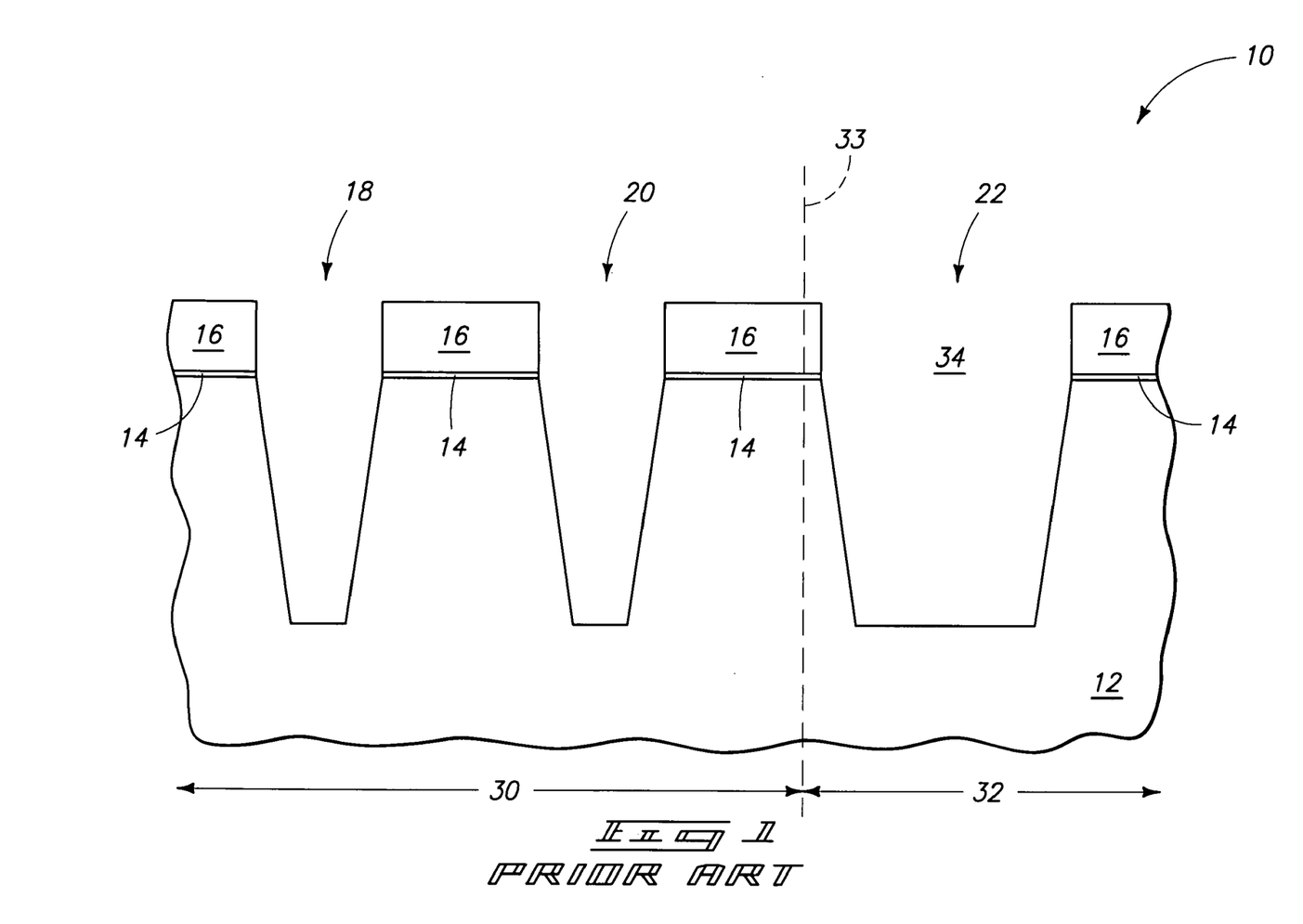
FIG. 1 is a diagrammatic, cross-sectional view of a semiconductor wafer fragment at a preliminary processing stage of a prior art method for forming oxide within openings.

A prior art method for forming various trenched isolation regions is described with reference to FIGS. 1-4. Referring initially to FIG. 1, a semiconductor construction 10 is illustrated at a preliminary processing stage. Construction 10 comprises a semiconductor substrate 12 which can correspond to, for example, a bulk monocrystalline silicon wafer. A patterned mask comprising layers 14 and 16 is formed over substrate 12. Layer 14 can comprise, consist essentially of, or consist of, for example, silicon dioxide; and layer 16 can comprise, consist essentially of, or consist of, for example, silicon nitride.

The patterned mask covers some regions of substrate 12, while leaving other regions exposed within gaps extending through the patterned mask. Trenches 18, 20 and 22 are formed to extend into substrate 12 within the gaps defined by the masking materials 14 and 16.

The substrate can be considered to comprise a defined memory array region 30 and a defined region 32 peripheral to the memory array region. The memory array region is a location of the substrate where memory devices will ultimately be formed in a tightly-packed array, and the peripheral region is a region of the substrate peripheral to the memory array. A dashed line 33 is provided to diagrammatically illustrate a boundary between the memory array region and the peripheral region.

Trenches 18 and 20 can correspond to so-called shallow trenches which are ultimately utilized for forming shallow trench isolation regions. The shallow trenches of shallow trench isolation regions can be any suitable depth, and frequently will be 3500 Å to 4000 Å deep. In the past, shallow trench isolation region trenches were typically kept to depths of less than 2000 Å, but it is now becoming common for the depths to be much deeper. The increasing depths of the trenches can improve isolation, but creates complications in filling the trenches.

The trench 22 is utilized for forming an isolation region between the memory array region and the peripheral region, and can be referred to as a moat between the memory array region and circuitry of the peripheral region. Such moat can be formed to a depth comparable to the depths of the shallow trench isolation regions, as shown, but is typically significantly wider than the shallow trench isolation regions. Accordingly, trench (or moat) 22 is shown to have a lower aspect ratio than the shallow trench isolation regions 18 and 20.

Although shallow trench isolation regions are shown being associated only with the memory array portion of the FIG. 1 construction, it is to be understood that shallow trench isolation regions can also be associated with peripheral circuitry, and typically it is desirable to form the shallow trench isolation regions associated with the peripheral circuitry simultaneously with the shallow trench isolation regions associated with the memory array circuitry, and also simultaneously with the formation of the isolation region trench 22 that separates peripheral region circuitry from the memory array region.

Figure 2:
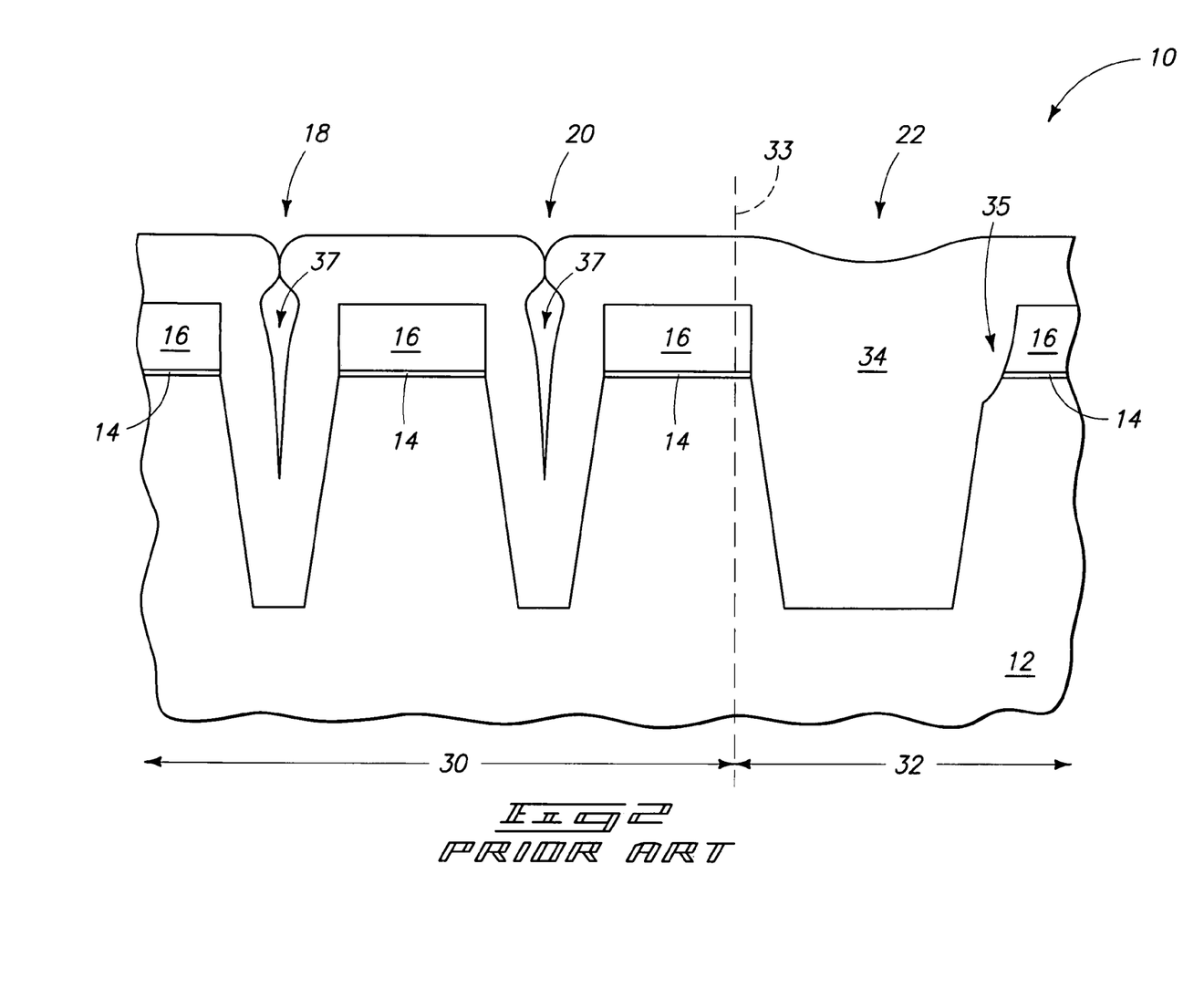
FIG. 2 is a view of the FIG. 1 wafer fragment shown at a prior art processing stage subsequent to that of FIG. 1.

Referring next to FIG. 2, oxide 34 is provided within trenches 18, 20 and 22. The oxide can be formed by, for example, a high-density plasma deposition process utilizing $SiH_4$ and $O_2$ as precursors, and further utilizing argon as a carrier gas. Accordingly, the plasma of the high-density plasma process can be formed from a gas consisting essentially of $SiH_4$, $O_2$ and Ar. For purposes of interpreting this disclosure and the claims that follow, a high-density plasma is defined as a plasma having a density of greater than or equal to about $10^{10}$ ions/cm$^3$.

High-density plasma processes are preferred for filling the trenches relative to other oxide-deposition processes, in that high-density plasma processes can avoid so-called bread-loafing. Bread-loafing occurs when deposited oxide pinches the top of a trench closed before the trench has been completely filled with oxide, and can thus result in formation of keyhole openings within the oxide. Such keyhole openings can degrade performance of oxide isolation regions. High-density plasma deposition processes advantageously form oxide more linearly along sidewalls of an opening than other oxide deposition processes, and so can more uniformly fill high-aspect-ratio openings than can other oxide deposition processes. However, some oxide material can still form along sidewalls of the openings during high-density plasma processes, and such material can eventually pinch off the openings so that voids result within the openings. Accordingly, oxide 34 is typically formed in a three-step process in an effort to avoid having the oxide prematurely pinch off the tops of the high-aspect-ratio trench openings.

The three-step process comprises a first step of high-density plasma deposition of oxide, a second step which is an etch to remove deposited materials from sidewalls of the trenches, and a third step which is to perform further high-density plasma deposition of oxide to completely fill the trenches. The high-density plasma depositions would be conducted at pressures below 10 mTorr, temperatures of from about 200° C. to about 500° C., a flow rate of silane of from about 10 standard cubic centimeters per minute (sccm)

to about 500 sccm, and a flow rate of oxygen of from about 60 sccm to about 500 sccm. The etch occurring between the high-density plasma depositions will typically utilize $NF_3$ at a flow rate of from about 100 sccm to about 1500 sccm, with a bias power to the substrate of from about 0 to 2000 watts, a temperature of from about 350° C. to about 750° C., a pressure below 10 mTorr, and a treatment time of from about 10 seconds to about 50 seconds.

Several problems can occur with the three-step process described above. For instance, the first high-density plasma deposition can form a significantly different amount of oxide along sidewalls of the relatively high-aspect-ratio trenches 18 and 20 relative to that formed along sidewalls of the relatively low-aspect-ratio trench 22 (with the terms "relatively high aspect ratio trench" and "relatively low aspect ratio trench" indicating that the referred-to trenches have high and low aspect ratios relative to one another, or in other words that the relatively high aspect ratio trench has a higher aspect ratio as compared to the relatively low aspect ratio trench). The effect of the etch on the oxide along the relatively low-aspect-ratio sidewalls of trench 22 can also be different than that along the relatively high-aspect-ratio sidewalls of trenches 18 and 20. Combined differences of etch rate and oxide thicknesses for the low-aspect-ratio trenches as compared to the high-aspect-ratio trench can lead to over-etching within the low-aspect-ratio trench 22, and under-etching with the high-aspect-ratio trenches 18 and 20. The over-etching can result in degradation of corners of materials 14, 16 and 12 proximate upper regions of the low-aspect-ratio trench, as illustrated by a degraded region 35 shown proximate trench 22. Also, the prior art processing may result in too much growth of oxide along the sidewalls of the high-aspect-ratio trenches 18 and 20 as compared to a rate at which the high-aspect-ratio trenches are filled, which can form the shown pinched crevices 37 (in other words, crevices with pinched-off upper regions) extending into the oxide within trenches 18 and 20.

Although only one degraded corner is shown within trench 22, it is to be understood that both upper corners of the shown cross-sectional view of the trench can be degraded. Also, although both of the high-aspect-ratio openings 18 and 20 are shown to have crevices extending therein, with both crevices being shown to extend to a similar depth, it is to be understood that the crevices would typically be non-uniform, with some of the high-ratio openings having relatively shallow crevices extending therein, and other openings having relatively deep crevices extending therein. Such non-uniformity creates complications in attempting to form consistent and uniform isolation regions across the entirety of a semiconductor substrate.

Figure 3:
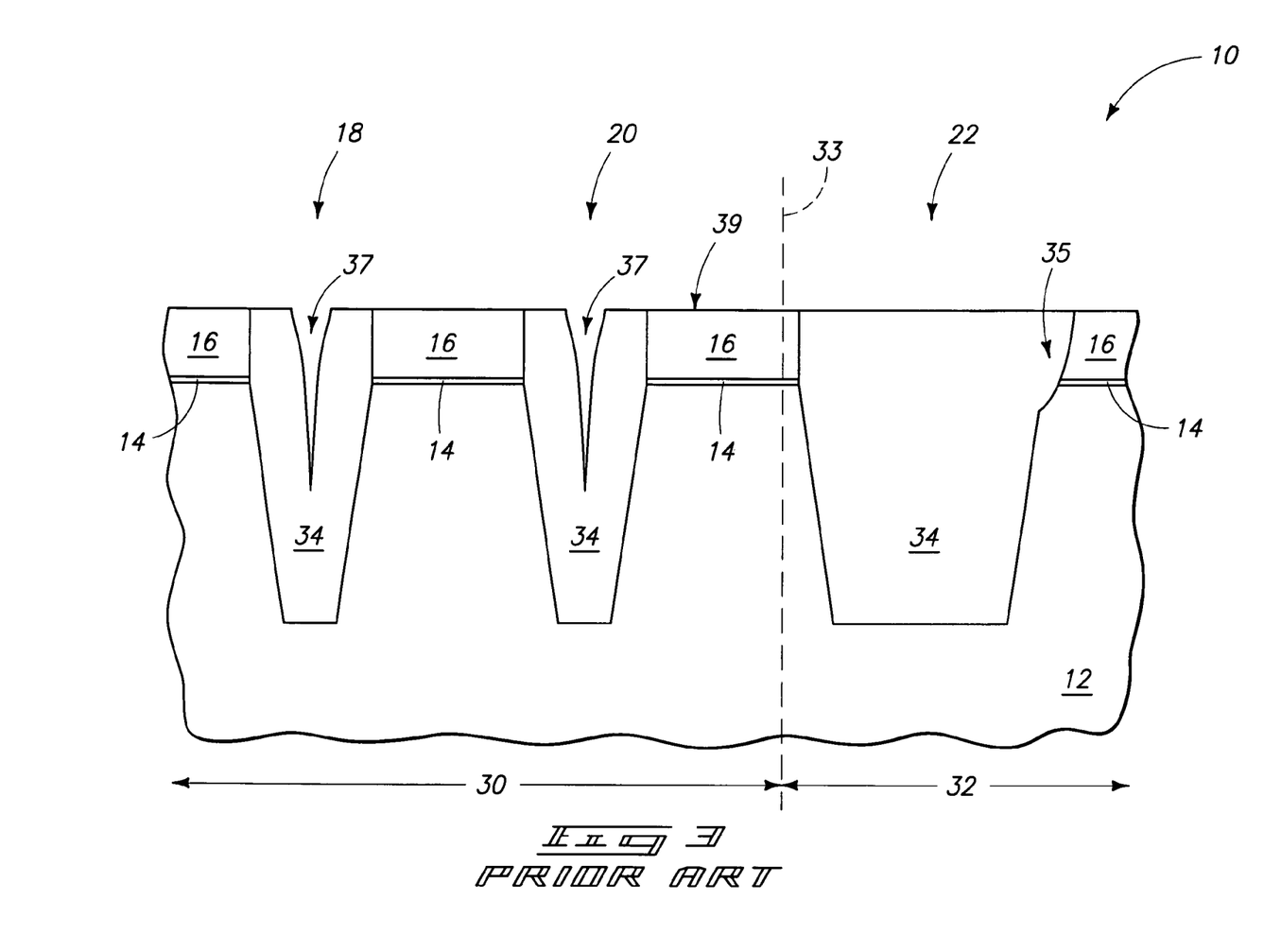
FIG. 3 is a view of the FIG. 1 wafer fragment shown at a prior art processing stage subsequent to that of FIG. 2.

Referring next to FIG. 3, material 34 is subjected to planarization (such as, for example, chemical-mechanical polishing) to remove the material from over the surfaces of layer 16, and thus form the shown planarized surface 39. Crevices 37 extend through such planarized surface and into the oxide 34 of the relatively high-aspect-ratio trenches 18 and 20.

Figure 4:
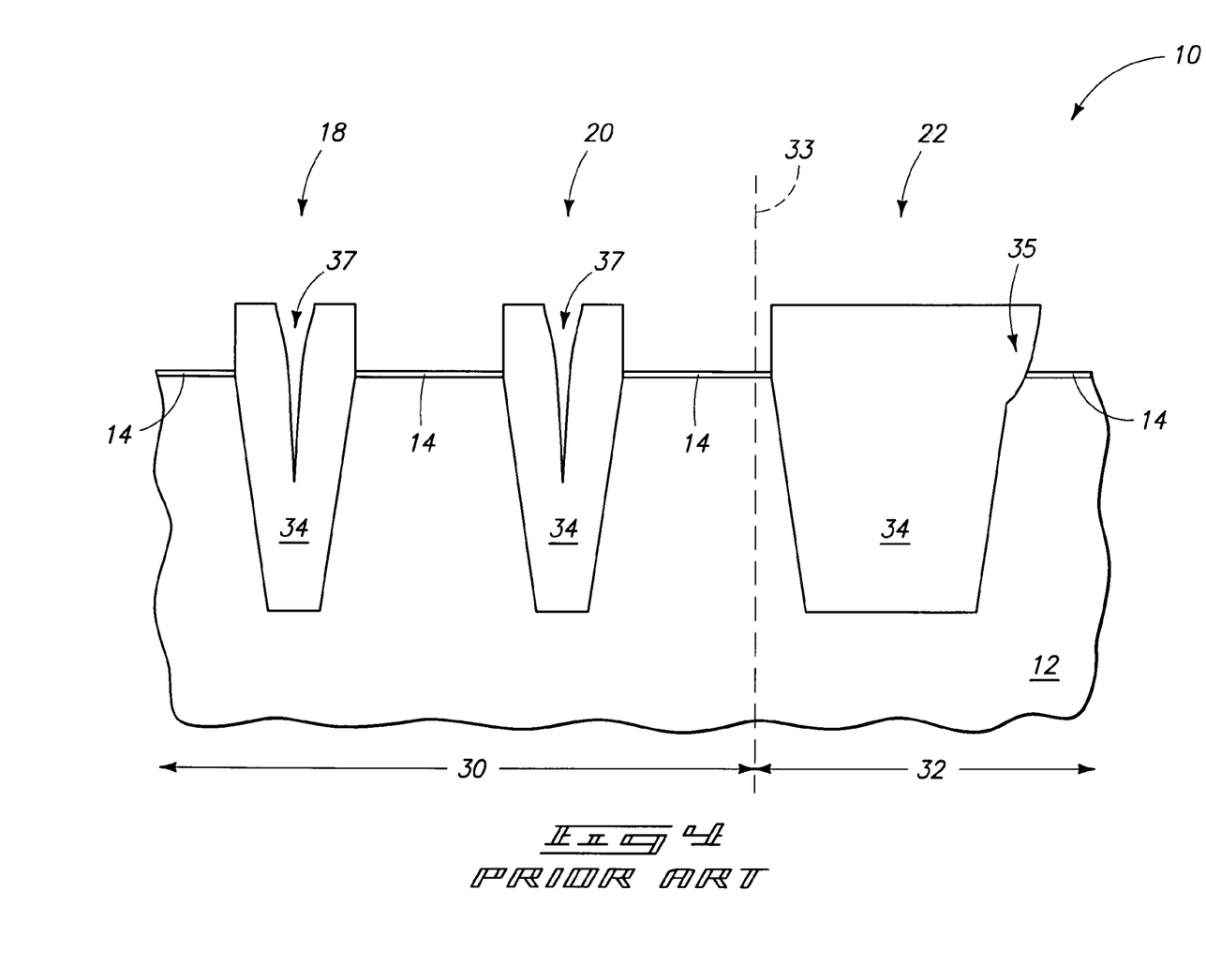
FIG. 4 is a view of the FIG. 1 wafer fragment shown at a prior art processing stage subsequent to that of FIG. 3.

Referring next to FIG. 4, masking material 16 (FIG. 3) is removed with an etch selective for silicon nitride relative to silicon dioxide. The oxide 34 remaining within trenches 18, 20 and 22 forms trenched isolation regions. Unfortunately, crevices 37 can impair performance of the trenched isolation regions formed within trenches 18 and 20, and the degraded corner 35 can impair performance of the isolation region formed within trench 22. Accordingly, it is desired to develop new processing procedures which alleviate, and preferably prevent, formation of crevices 37 and degraded corner 35.

SUMMARY OF THE INVENTION

In one aspect, the invention encompasses a method of filling an opening with oxide. A substrate is provided which has an opening extending therein. A first oxide is deposited within the opening with a first deposition. The first deposition comprises exposure of the substrate to a pressure of greater than 15 mTorr. The first oxide is etched to remove a portion of the first oxide and leave some of the first oxide remaining within the opening. After the etching, second oxide is deposited within the opening with a second deposition comprising exposure of the substrate to pressure of less than or equal to 10 mTorr.

In one aspect, the invention encompasses a method of filling a plurality of trenches with oxide. A substrate is provided which has a plurality of trenches extending therein. A first of the trenches has a relatively high aspect ratio and a second of the trenches has a relatively low aspect ratio. The first and second trenches have first and second upper sidewall surfaces, respectively. A first oxide is deposited within the trenches with a first deposition. The first deposition comprises exposure of the substrate to a pressure of greater than 15 mTorr. The first oxide forms a greater thickness along the second sidewall upper surface than along the first sidewall upper surface. The first oxide is etched to remove a portion of the first oxide and leave some of the first oxide remaining within the first and second trenches. After the etching, a second oxide is deposited within the first and second trenches with a second deposition. The second deposition comprises exposure of the substrate to a pressure of less than or equal to 10 mTorr.

In one aspect, the invention encompasses a method of forming trenched isolation regions. A substrate is provided which has a plurality of trenches extending therein. The substrate has a memory array region, and a region peripheral to the memory array region. Several of the trenches are within the memory array region and have a relatively high aspect ratio. At least one of the trenches is within the peripheral region and has a relatively low aspect ratio. The several trenches are first trenches, and the at least one trench is a second trench. A first oxide is deposited within the first and second trenches with a first deposition. The first deposition comprises exposure of the substrate to a pressure of greater than 15 mTorr. The first oxide is etched to remove a portion of the first oxide and leave some of the first oxide remaining within the first and second trenches. After the etching, a second oxide is deposited within the trenches with a second deposition comprising exposure of the substrate to a pressure of less than or equal to 10 mTorr. The second oxide fills the first trenches to form trenched isolation regions within the first trenches. Circuit devices are formed which are electrically isolated from one another by the trenched isolation regions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In one aspect, the invention includes a recognition that increasing the pressure of a high-density plasma oxide deposition improves sidewall deposition of oxide within relatively low-aspect-ratio trenches, which can alleviate prior art problems discussed in the "Background" section of this disclosure. Utilization of approaches described herein can enable good silicon dioxide fill within shallow trench isolation regions in an array, while avoiding damage along relatively low-aspect-ratio trenches within a peripheral region of a semiconductor substrate.

Figure 5:
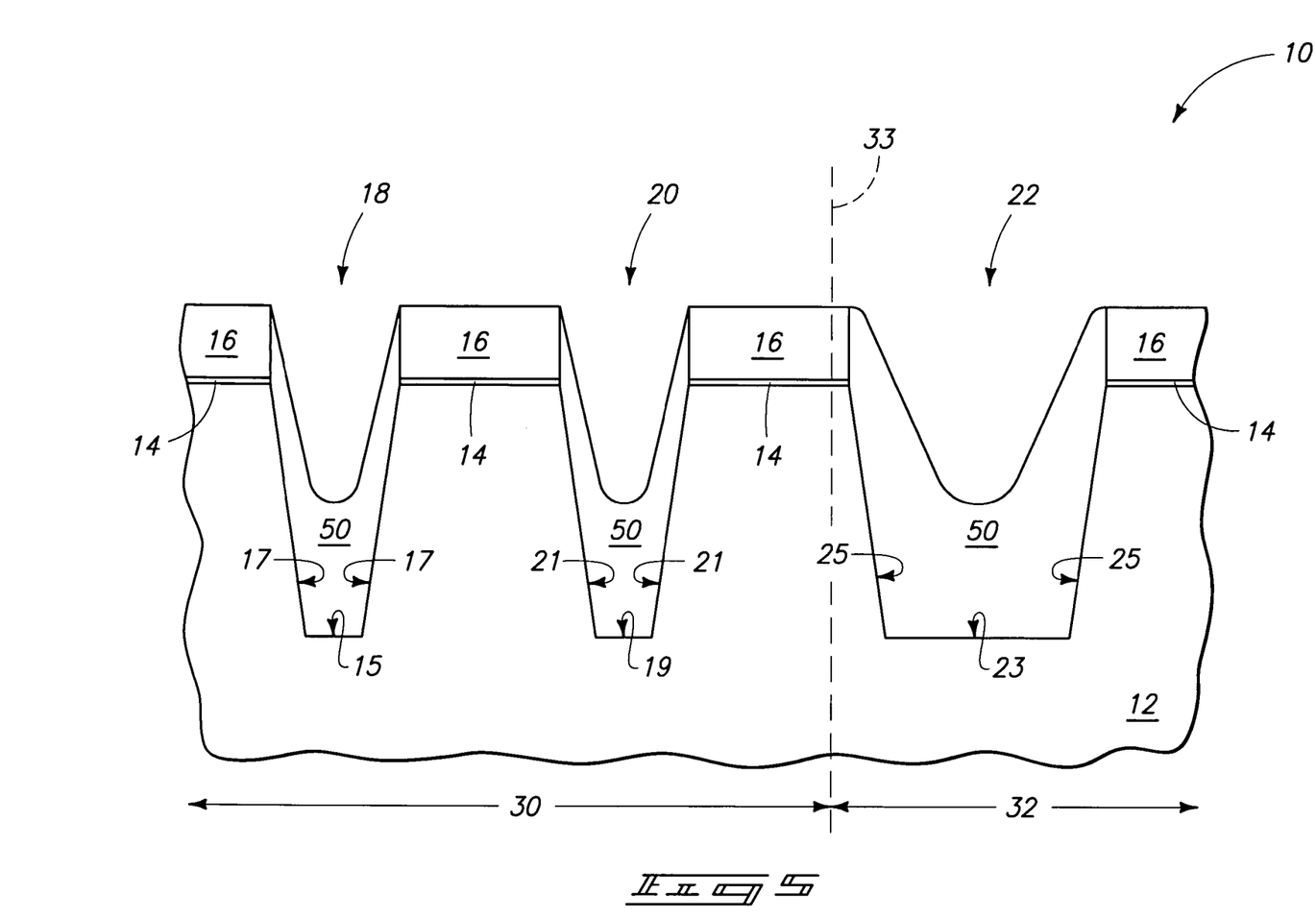
FIG. 5 is a diagrammatic, cross-sectional view of a semiconductor wafer fragment shown at a processing stage subsequent to that of FIG. 1 in accordance with an exemplary aspect of the present invention.

An exemplary aspect of the present invention is described with reference to FIGS. 5-10. Referring initially to FIG. 5, a semiconductor wafer construction 10 is illustrated at a processing stage subsequent to the prior art processing stage discussed previously with reference to FIG. 1. In referring to FIG. 5, similar numbering will be utilized as was utilized above in describing FIG. 1, where appropriate. Construction 10 of FIG. 5 comprises a semiconductor substrate 12 defined to comprise a memory array region 30 and a region 32 peripheral to the memory array region, with regions 30 and 32 being diagrammatically illustrated as separated from one another by a boundary 33.

Masking materials 14 and 16 are over substrate 12; and trenches 18, 20 and 22 extend into the substrate in gaps defined by the masking layers. Masking layers 14 and 16 can comprise, consist essentially of, or consist of silicon dioxide and silicon nitride, respectively, as discussed above with reference to FIG. 1. Trenches 18 and 20 are relatively high-aspect-ratio trenches, and trench 22 is a relatively low-aspect-ratio trench. Trenches 18 and 20 can, for example, have depths of at least about 2000 Å, or in some applications at least about 3500 Å. Trenches 18 and 20 can have aspect ratios that are at least about twice as large as the aspect ratio of trench 22.

Trenches 18, 20 and 22 can be considered to be openings extending into semiconductor substrate 12. In some aspects, trenches 18 and 20 can be considered to be first trenches having a relatively high aspect ratio and trench 22 can be considered a second trench having a relatively low aspect ratio. Trenches 18 and 20 correspond to a representative pair of a plurality of trenches that would typically be formed within the memory array region. Trenches of such plurality may or may not have aspect ratios substantially the same as one another, but generally would have relatively high aspect ratios in comparison to one or more trenches associated with the peripheral region of the semiconductor substrate. Trench 22 illustrates an exemplary trench associated with a peripheral region of a semiconductor substrate, but it is to be understood that the substrate can have numerous trenches associated with the peripheral region at the processing stage of FIG. 5. Some of the trenches of the peripheral region can be relatively low-aspect-ratio trenches, and others can be relatively high-aspect-ratio trenches. Generally, however, at least one of the trenches of the peripheral region will be a relatively low-aspect-ratio trench in comparison to one or more trenches associated with the memory array region of the semiconductor substrate.

Trench 18 has a bottom periphery 15, and sidewalls 17 extending upwardly from the bottom periphery; trench 20 has a bottom periphery 19 and sidewalls 21 extending upwardly from the bottom periphery; and trench 22 has a bottom periphery 23 and sidewalls 25 extending upwardly from the bottom periphery. Sidewalls 17, 21 and 25 can be referred to as sidewall surfaces. Such sidewall surfaces can be divided into lower sidewall surfaces within the bottom portions of trenches 18, 20 and 22, and upper sidewall surfaces within the higher-elevation regions of trenches 18, 20 and 22. The upper sidewall surfaces are generally surfaces within a top half of the trenches, but also can be defined as regions where a first deposit of oxide thins within the trenches rather than by a specific elevational percentage of the trench depth. The upper sidewall surfaces of trenches 18 and 20 can be referred to as first upper sidewall surfaces, and the upper sidewall surfaces of trench 22 can be referred to as second upper sidewall surfaces.

A material 50 is deposited within trenches 18, 20 and 22. Material 50 can comprise, consist essentially of, or consist of silicon dioxide, and can be referred to as a first oxide formed within the openings 18, 20 and 22. The first oxide 50 is deposited under a pressure of greater than 15 mTorr. In other words, construction 10 is provided within a reaction chamber, and a pressure within the chamber is maintained at greater than 15 mTorr during deposition of oxide 50 within openings 18, 20 and 22. The deposition typically utilizes a high-density plasma with silane and oxygen as precursors.

Exemplary reaction conditions for forming silicon dioxide material 50 include a temperature of construction 10 of from about 200° C. to about 500° C.; a flow rate of silane into the reaction chamber of from about 10 sccm to about 500 sccm, (with a common flow rate being from about 10 sccm to about 150 sccm, and in particular aspects the flow rate can be from about 40 sccm to about 80 sccm); a flow rate of oxygen into the reaction chamber of from about 60 sccm to about 500 sccm, (with a typical flow rate being from about 60 sccm to about 180 sccm); a bias power to the substrate of from about 2000 watts to about 5000 watts; an RF power to a top of the reaction chamber of from about 3000 watts to about 5000 watts; and a pressure within the reaction chamber of from about 15 mTorr to about 30 mTorr, (in some aspects the pressure can be greater than 30 mTorr). The deposition can be conducted for a time of from about 5 seconds to about 30 seconds.

The high-pressure-deposition utilized in accordance with methodology of the present invention advantageously selectively forms oxide material 50 to be thicker along the sidewalls 25 of the relatively low-aspect-ratio trench 22 as compared to the formation of oxide along the sidewalls 17 and 21 of the relatively high-aspect-ratio openings 18 and 20. Thus, oxide material 50 is formed to be thicker on upper sidewall surfaces of trench 22 than on upper sidewall surfaces of trenches 18 and 20.

Figure 6:
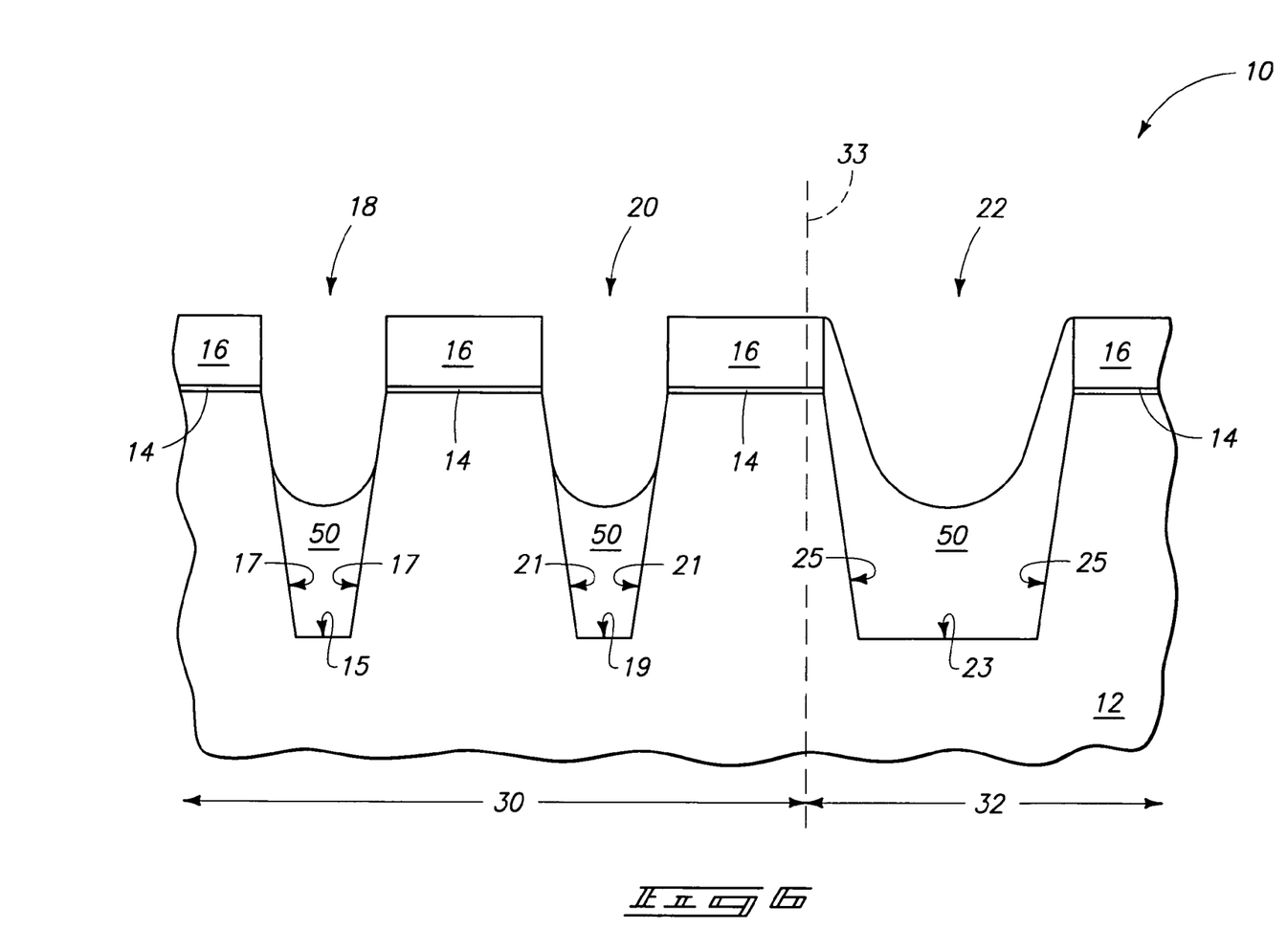
FIG. 6 is a view of the FIG. 5 wafer fragment shown at a processing stage subsequent to that of FIG. 5.

Referring next to FIG. 6, oxide material 50 is subjected to an etch which removes a portion of the oxide, and yet leaves some of the oxide remaining within the openings 18, 20 and 22. Since the oxide is thinner along upper sidewall surfaces of openings 18 and 20 than along upper sidewalls surfaces of opening 22, the etch can be conducted to substantially entirely remove the oxide from along upper sidewall surfaces of openings 18 and 20 while leaving some of the oxide along the upper sidewall surfaces of the relatively low-aspect-ratio opening 22. Such can avoid the problematic etching of materials 12, 14 and 16 that was discussed with reference to prior art FIG. 2 as leading to formation of degraded corner 35. Also, by removing substantially all of the oxide material 50 from along upper sidewall surfaces of relatively high-aspect-ratio openings 18 and 20, the etch can prepare openings 18 and 20 for subsequent deposition of oxide to avoid formation of the pinched crevices 37 discussed above with reference to FIG. 2.

The etch utilized to remove some of oxide material 50 can be conducted with $NF_3$ as the primary etchant. In exemplary processes, the etch can comprise a flow rate of $NF_3$ into a reaction chamber of from about 100 sccm to about 1500 sccm; a bias power to the construction 10 within the chamber of from about 0 watts to about 2000 watts; a temperature within the chamber of from about 350° C. to about 750° C.; and a pressure within a chamber of less than about 10 mTorr. The etch can be conducted utilizing a plasma, with such plasma being either a high-density plasma or a plasma which is not high-density.

Figure 7:
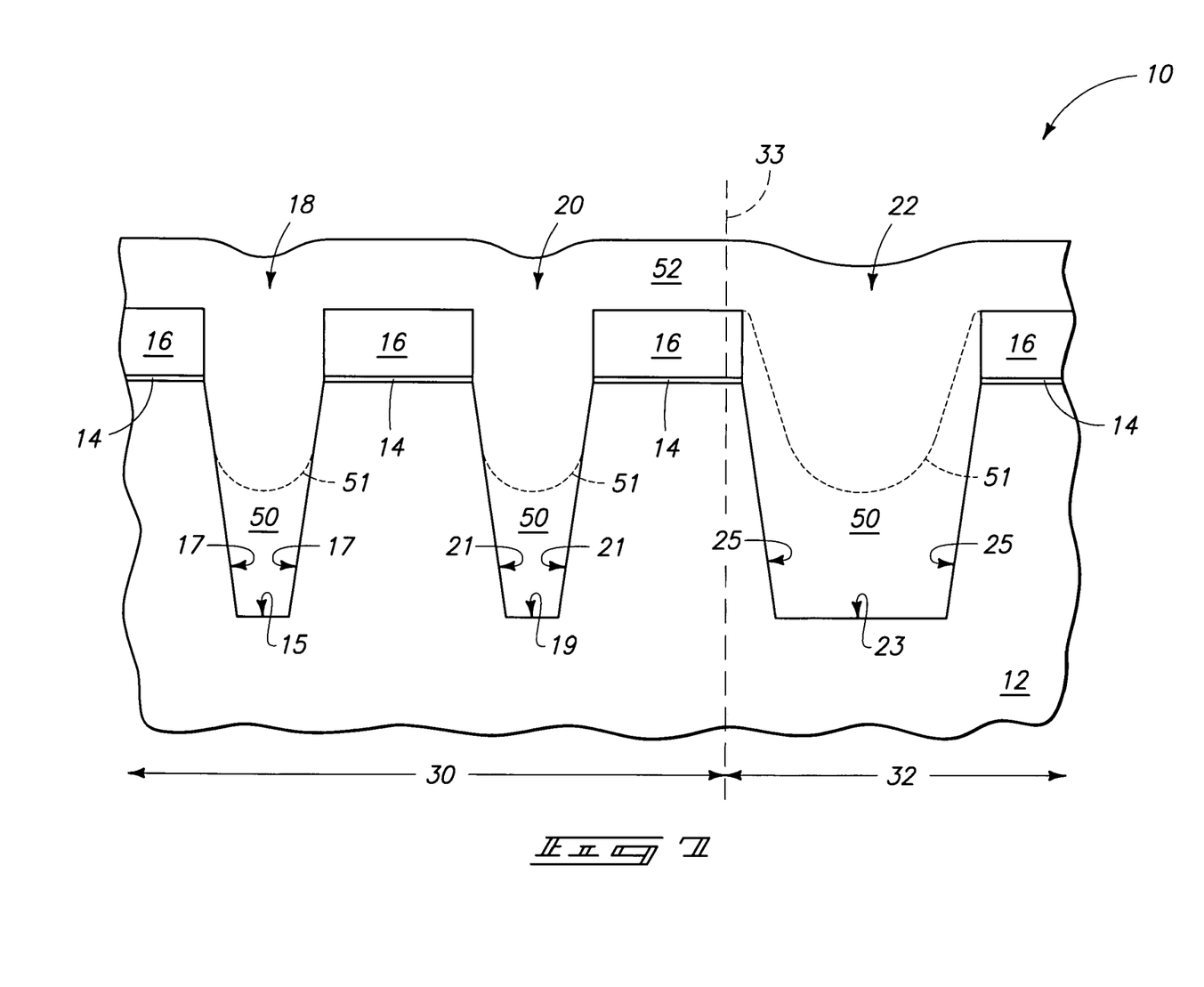
FIG. 7 is a view of the FIG. 5 wafer fragment shown at processing stage subsequent to that of FIG. 6.

Referring to FIG. 7, a second material 52 is deposited within openings 18, 20 and 22, and over first material 50. In particular aspects, second material 52 comprises, consists essentially of, or consists of silicon dioxide. Accordingly, second material 52 can comprise an identical composition as first material 50. Dashed lines 51 are provided to show a diagrammatic boundary between materials 50 and 52 to assist in this explanation, but in typical aspects materials 50 and 52 would be the same as one another and would thus merge into a single material filling the openings 18, 20 and 22.

Material 52 is typically silicon dioxide deposited with a high-density plasma process utilizing a pressure of less than or equal to 10 mTorr. An exemplary process is conducted within a reaction chamber utilizing silane and oxygen ($O_2$) precursors. The flow rate of silane into the chamber is from about 10 sccm to about 500 sccm, (typically from about 10 sccm to about 150 sccm, with from about 40 sccm to about 80 sccm being preferred in some instances); and the flow rate of oxygen is from about 60 sccm to about 500 sccm, (typically from about 60 sccm to about 180 sccm). A temperature within the chamber is typically from about 300° C. to about 750° C. The temperature is higher than that utilized for the first deposition due to the temperature within the reaction chamber being uncontrolled, and accordingly increasing during the first deposition and etch. The temperature of the second deposition can, in some instances, be conducted at the same temperature as that utilized for the first deposition if a temperature within the reaction chamber is controlled to maintain the temperature at from about 200° C. to about 500° C. A bias power to construction 10 during the second oxide deposition will typically be higher than the bias power utilized during the first oxide deposition, and generally will be about 1000 watts higher than the bias power utilized during the first oxide deposition.

Utilization of a pressure of less than 10 mTorr together with a relatively high bias power during the second deposition can advantageously enable uniform filling of openings 18, 20 and 22 (as shown). Further, the utilization of first deposition conditions which kept very thin oxide along sidewalls of relatively high-aspect-ratio trenches 18 and 20, followed by removal of substantially all of the oxide from along the upper sidewall surfaces of openings 18 and 20, enables second oxide 52 to be deposited within the relatively high-aspect-ratio openings without formation of the pinched crevices 37 of the prior art process of FIG. 2.

Since opening 22 has a relatively low aspect ratio, the opening can be uniformly filled with oxide 52 without formation of a pinched crevice even though some of the first oxide 50 remains along upper sidewall surfaces of trench 22 during deposition of second oxide 52.

Figure 8:
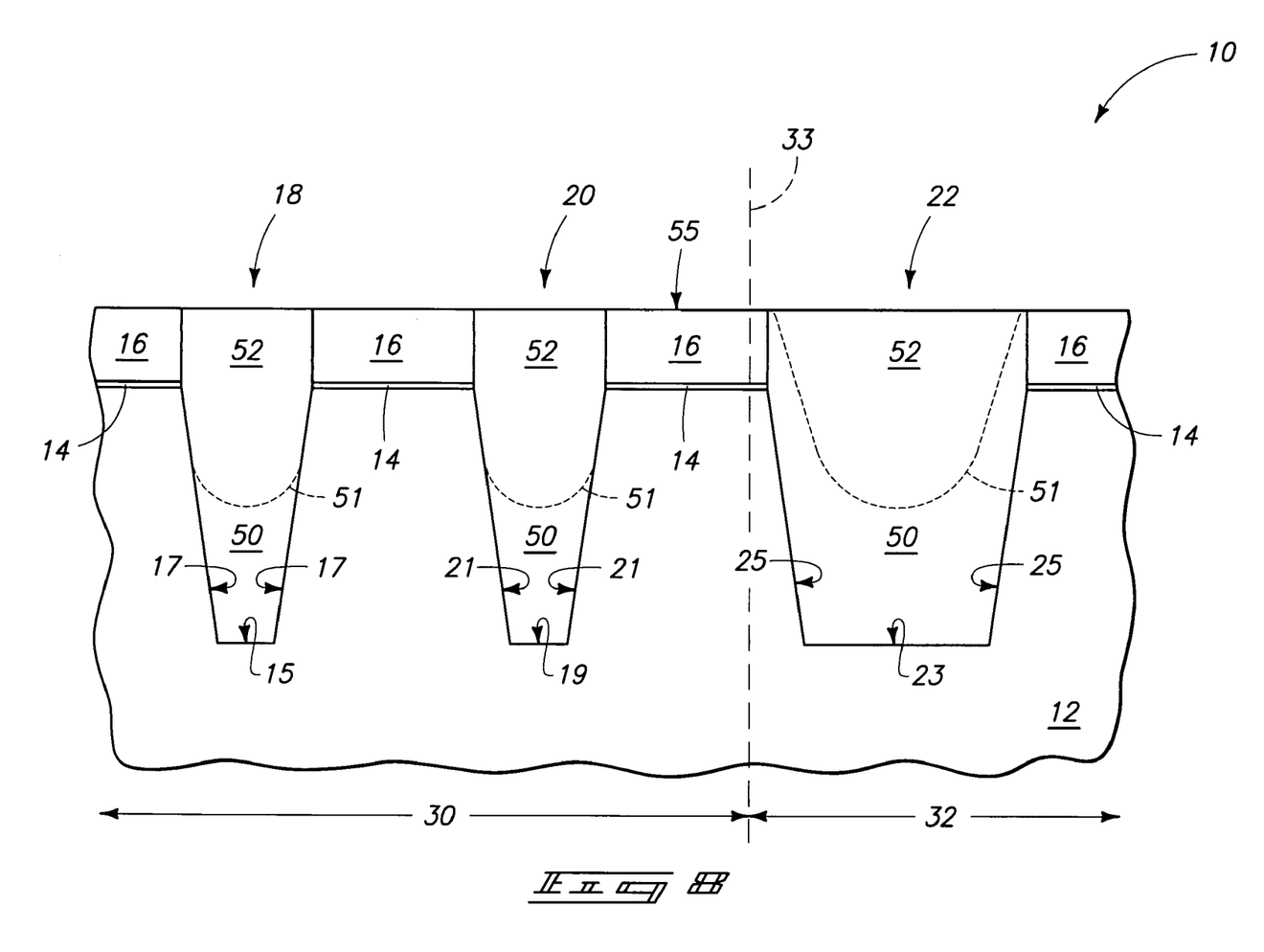
FIG. 8 is a view of the FIG. 5 wafer fragment shown at a processing stage subsequent to that of FIG. 7.

Referring next to FIG. 8, oxide material 52 is removed from over material 60 with a planarization process (such as, for example, chemical-mechanical planarization) which forms a planarized upper surface 55 extending across construction 10. The planarization can stop on the initial upper surface of material 16, or can remove some of material 16 so that the planarized upper surface 55 is actually elevationally below the starting uppermost surface of the material 16 that existed prior to the planarization process.

Figure 9:
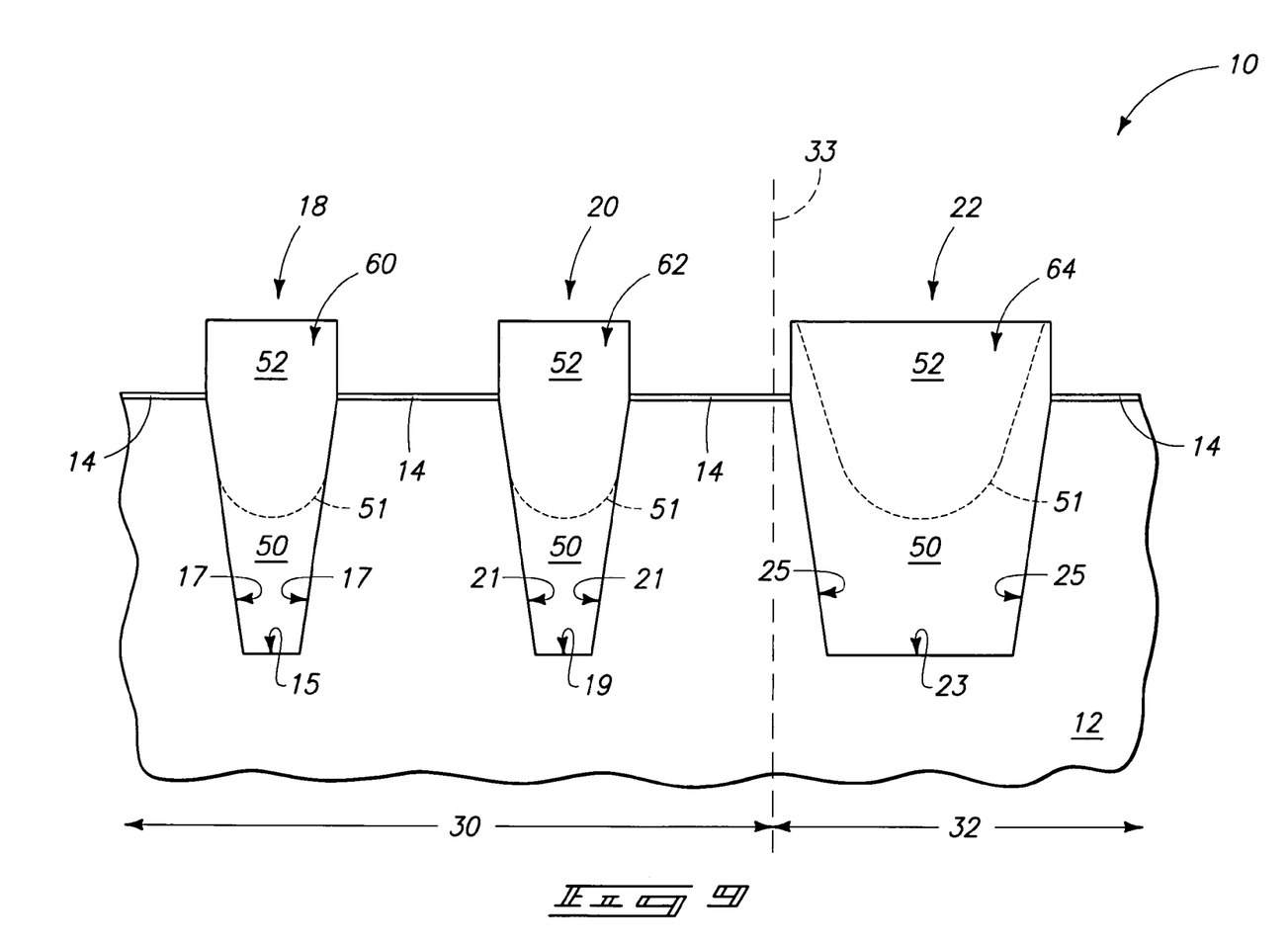
FIG. 9 is view of the FIG. 5 wafer fragment shown at a processing stage subsequent to that of FIG. 8.

Referring to FIG. 9, material 16 (FIG. 8) is removed. The remaining materials 50 and 52 within trenches 18, 20 and 22 form isolation regions 60, 62 and 64, respectively. The isolation regions are advantageously uniformly filled with oxide materials 50 and 52, and further the isolation region 64 advantageously does not have degraded corners of substrate 12 adjacent thereto. Accordingly, the problems described with reference to prior art FIGS. 2-4 (specifically the crevices 37 and degraded corner 35) are avoided, and preferably prevented.

Figure 10:
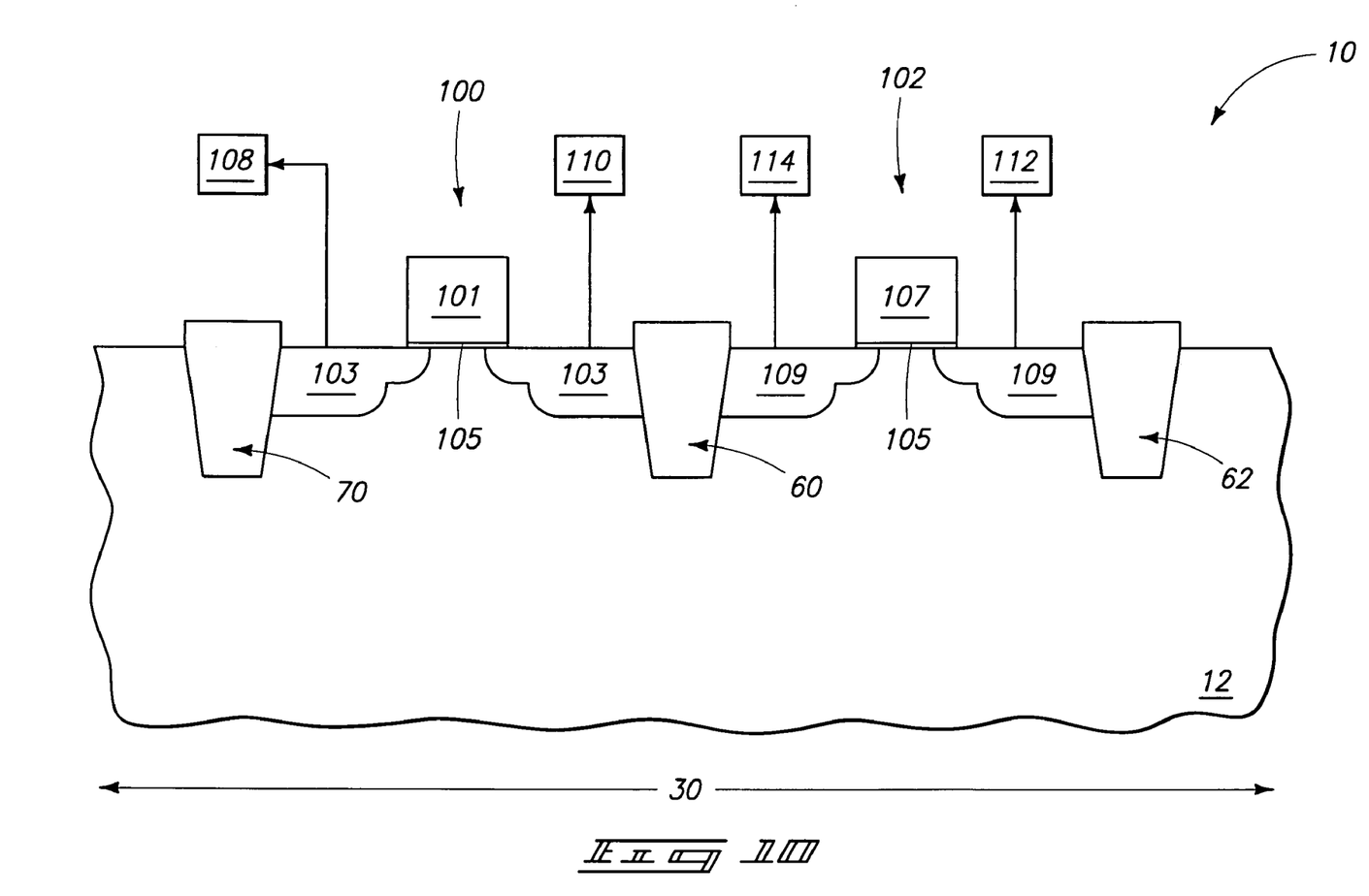
FIG. 10 is a view of a memory array region of a semiconductor wafer substrate shown at a processing stage subsequent to that of FIG. 9.

Referring next to FIG. 10, a portion of construction 10 associated with memory array region 30 is shown at a processing stage subsequent to that of FIG. 9, and is shown comprising an isolation region 70 in addition to the above-discussed isolation regions 60 and 62. Isolation region 70 can be identical to the regions 60 and 62, and can be formed during the processing utilized to form isolation regions 60 and 62. The isolation regions 60, 62 and 70 can correspond to so-called shallow trench isolation regions.

Circuit devices 100 and 102 are shown formed to be supported by substrate 12, and to be electrically isolated from one another by the trenched isolation region 62. Circuit devices 100 and 102 correspond to field effect transistors, and are diagrammatically illustrated to comprise conductive gates 101 and 107, respectively; and to comprise source/drain regions 103 and 109 respectively. The gates are spaced from substrate 12 by a dielectric material 105 which can correspond to, for example, silicon dioxide. The gates can be segments along wordlines of a memory array.

The transistor device 100 has one of the source/drain regions 103 connected to a circuit element 108 and another of the source/drain regions 103 connected to a circuit element 110; and similarly transistor device 102 has one of the source/drain regions 103 extending to the circuit device 112 and another of the source/drain regions 103 extending to a circuit device 114. Some of the circuit elements can correspond to capacitor structures, and others can correspond to bitlines. Accordingly, the circuit components of FIG. 10 can be part of a dynamic random access memory array.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of filling an opening with oxide, comprising:
   providing a substrate having an opening extending therein;
   depositing first oxide within the opening with a first deposition comprising exposure of the substrate to a pressure of greater than 15 mTorr;
   etching the first oxide to remove a portion of the first oxide and leave some of the first oxide remaining within the opening; and
   after the etching, depositing second oxide within the opening with a second deposition comprising exposure of the substrate to a pressure of less than or equal to 10 mTorr.

2. The method of claim 1 wherein the first and second depositions utilize high-density plasma.

3. The method of claim 1 wherein the first deposition utilizes high-density plasma; a temperature of from about 200° C. to about 500° C.; a bias power to the substrate of from about 2000 watts to about 5000 watts; a silane precursor; and an oxygen precursor.

4. The method of claim 3 wherein the second deposition utilizes high-density plasma; a temperature of from about 300° C. to about 750° C.; a bias power to the substrate that is about 1000 watts higher than the bias power utilized during the first deposition; a silane precursor; and an oxygen precursor.

5. The method of claim 1 wherein the etching utilizes $NF_3$.

6. A method of filling a plurality of trenches with oxide, comprising:
   providing a substrate having a plurality of trenches extending therein, a first of the trenches having a first aspect ratio and a second of the trenches having a second aspect ratio that is less than the first aspect ratio; the first and second trenches having first and second upper sidewall surfaces, respectfully;
   depositing first oxide within the trenches with a first deposition comprising exposure of the substrate to a pressure of greater than 15 mTorr, the first oxide forming a greater thickness along the second sidewall upper surface than along the first sidewall upper surface;
   etching the first oxide to remove a portion of the first oxide and leave some of the first oxide remaining within the first and second trenches; and
   after the etching, depositing second oxide within the first and second trenches with a second deposition comprising exposure of the substrate to a pressure of less than or equal to 10 mTorr.

7. The method of claim 6 wherein the aspect ratio of the second trench is at least about a factor of two less than the aspect ratio of the first trench.

8. The method of claim 6 wherein the substrate comprises a memory array region and a region peripheral to the memory array region; wherein the first trench is within the memory array region; and wherein the second trench is within the region peripheral to the memory array region.

9. The method of claim 6 wherein the first and second depositions utilize high-density plasma.

10. The method of claim 6 wherein the first deposition utilizes high-density plasma; a temperature of from about 200° C. to about 500° C.; a bias power to the substrate of from about 2000 watts to about 5000 watts; a silane precursor; and an oxygen precursor.

11. The method of claim 10 wherein the second deposition utilizes high-density plasma; a temperature of from about 300° C. to about 750° C.; a bias power to the substrate that is about 1000 watts higher than the bias power utilized during the first deposition; a silane precursor; and an oxygen precursor.

12. The method of claim 6 wherein the etching utilizes $NF_3$.

13. A method of forming trenched isolation regions, comprising:
   providing a substrate having a plurality of trenches extending therein, the substrate having a memory array region and a region peripheral to the memory array region; several of the trenches being within the memory array region and having a relatively high aspect ratio; at least one of the trenches being within the peripheral region and having a relatively low aspect ratio; the several trenches being first trenches and the at least one trench being a second trench;
   depositing first oxide within the first and second trenches with a first deposition comprising exposure of the substrate to a pressure of greater than 15 mTorr;
   etching the first oxide to remove a portion of the first oxide and leave some of the first oxide remaining within the first and second trenches;
   after the etching, depositing second oxide within the trenches with a second deposition comprising exposure of the substrate to a pressure of less than or equal to 10 mTorr; the second oxide filling the first trenches to form trenched isolation regions within the first trenches; and
   forming circuit devices electrically isolated from one another by the trenched isolation regions.

14. The method of claim 13 wherein the aspect ratio of the second trench is at least about a factor of two less than the aspect ratio of the first trenches.

15. The method of claim 13 wherein the first and second depositions utilize high-density plasma.

16. The method of claim 13 wherein the first deposition utilizes high-density plasma; a temperature of from about 200° C. to about 500° C.; a bias power to the substrate of from about 2000 watts to about 5000 watts; a silane precursor; and an oxygen precursor.

17. The method of claim 16 wherein the second deposition utilizes high-density plasma; a temperature of from about 300° C. to about 750° C.; a bias power to the substrate that is about 1000 watts higher than the bias power utilized during the first deposition; a silane precursor; and an oxygen precursor.

18. The method of claim 13 wherein the etching utilizes $NF_3$.

19. The method of claim 13 wherein the first trenches have depths of at least about 2000 Å.

20. The method of claim 13 wherein the first trenches have depths of at least about 3500 Å.

* * * * *